US012339685B2

(12) United States Patent
Rogers

(10) Patent No.: US 12,339,685 B2
(45) Date of Patent: Jun. 24, 2025

(54) METHOD AND CIRCUITS TO PROVIDE HIGHER SUPPLY VOLTAGE FOR ANALOG COMPONENTS FROM LOWER SUPPLY VOLTAGES

(71) Applicant: Analog Bits Inc., Sunnyvale, CA (US)

(72) Inventor: Alan C. Rogers, Palo Alto, CA (US)

(73) Assignee: Analog Bits Inc., Sunnyvale, CA (US)

( * ) Notice: Subject to any disclaimer, the term of this patent is extended or adjusted under 35 U.S.C. 154(b) by 0 days.

(21) Appl. No.: 18/622,136

(22) Filed: Mar. 29, 2024

(65) Prior Publication Data

US 2024/0427359 A1 Dec. 26, 2024

Related U.S. Application Data

(63) Continuation of application No. 17/837,176, filed on Jun. 10, 2022, now Pat. No. 11,947,371, which is a continuation of application No. 17/233,839, filed on Apr. 19, 2021, now Pat. No. 11,360,500, which is a continuation of application No. 16/908,859, filed on Jun. 23, 2020, now Pat. No. 10,983,543.

(51) Int. Cl.
| | | |
|---|---|---|
| *G05F 1/46* | (2006.01) | |
| *H02M 3/07* | (2006.01) | |
| *H03K 3/03* | (2006.01) | |
| *H03K 5/24* | (2006.01) | |

(52) U.S. Cl.
CPC ............... *G05F 1/46* (2013.01); *H02M 3/07* (2013.01); *H03K 3/0315* (2013.01); *H03K 5/24* (2013.01)

(58) Field of Classification Search
CPC ........................................ G05F 1/46

USPC ........................................................ 327/109
See application file for complete search history.

(56) References Cited

U.S. PATENT DOCUMENTS

| | | |
|---|---|---|
| 5,889,428 A | 3/1999 | Young |
| 5,907,484 A | 5/1999 | Kowshik et al. |
| 6,075,403 A | 6/2000 | Ishikawa et al. |
| 6,618,296 B2 | 9/2003 | Zhang et al. |
| 6,791,212 B2 | 9/2004 | Pulvirenti et al. |

(Continued)

OTHER PUBLICATIONS

De Donno et al., "RAMSES: RFID Augmented Module for Smart Environmental Sensing," IEEE Transactions on Instrumentation and Measurement, Jul. 2014 , 63(7):1701-1708.

(Continued)

*Primary Examiner* — Tomi Skibinski
(74) *Attorney, Agent, or Firm* — Fish & Richardson P.C.

(57) ABSTRACT

A mixed-signal integrated circuit (IC), including: a voltage booster that includes one or more charge pump devices configured to receive an input voltage, an oscillator signal, and a control signal, wherein the one or more charge pump devices comprise a network of capacitors switchable to provide a charged pumped in response to the control signal, and wherein the one or more charge pump devices, using the pumped, generate a boosted voltage based on the input voltage and at least a portion of an amplitude of the oscillator signal, a voltage regulator coupled to the one or more charge pump devices and configured to receive the boosted voltage and generate a regulated boosted voltage based on the boosted voltage, and a control and monitoring engine configured to provide the control signal based on, at least in part, the input voltage, the oscillator signal, and the regulated boosted voltage.

4 Claims, 3 Drawing Sheets

(56) References Cited

U.S. PATENT DOCUMENTS

| | | |
|---|---|---|
| 6,815,999 B2 | 11/2004 | Brani |
| 6,856,525 B2 | 2/2005 | Wallis |
| 7,157,960 B2 | 1/2007 | Kim et al. |
| 7,663,427 B2 | 2/2010 | Fujiwara |
| 8,362,823 B2 | 1/2013 | Lin et al. |
| 8,736,247 B2 | 5/2014 | Hisano |
| 10,983,543 B1 | 4/2021 | Rogers |
| 11,360,500 B2 | 6/2022 | Rogers |
| 11,947,371 B2 | 4/2024 | Rogers |
| 2008/0024198 A1 | 1/2008 | Bitonti et al. |
| 2009/0072891 A1* | 3/2009 | Perisetty ............... H02M 3/073 327/536 |
| 2012/0139622 A1 | 6/2012 | Ryu |
| 2012/0169404 A1 | 7/2012 | Cook et al. |
| 2014/0048686 A1 | 2/2014 | Johansson et al. |
| 2014/0103967 A1* | 4/2014 | Yang ..................... H05K 13/00 327/333 |
| 2015/0372591 A1 | 12/2015 | Seshita |
| 2019/0103824 A1 | 4/2019 | Kim et al. |
| 2021/0397206 A1 | 12/2021 | Rogers |

OTHER PUBLICATIONS

Extended European Search Report in European Appln. No. 21828907.2, dated Nov. 9, 2023, 11 pages.

Hasan et al., "Step-up LDO voltage regulator for a self-powered biosensor," 2017 IEEE Sensors, Oct. 29, 2017, 3 pages.

Hu et al., "An Integrated Power Recovery Module Dedicated to Implantable Electronic Devices," Analog Integrated Circuits and Signal Processing, May 2005, 43(2):171-181.

International Preliminary Report on Patentability in International Appln. No. PCT/US2021/038521, mailed on Jan. 5, 2023, 5 pages.

International Search Report and Written Opinion in International Appln. No. PCT/US2021/038521, dated Jul. 22, 2021, 6 pages.

* cited by examiner

METHOD AND CIRCUITS TO PROVIDE HIGHER SUPPLY VOLTAGE FOR ANALOG COMPONENTS FROM LOWER SUPPLY VOLTAGES

CROSS REFERENCE TO RELATED APPLICATION

This application is a continuation of U.S. application Ser. No. 17/837,176, filed Jun. 10, 2022, which is a continuation of U.S. application Ser. No. 17/233,839, filed Apr. 19, 2021, (now U.S. Pat. No. 11,360,500) which is a continuation of U.S. application Ser. No. 16/908,859, filed Jun. 23, 2020, (now U.S. Pat. No. 10,983,543), the contents of which are incorporated by reference herein.

TECHNICAL FIELD

The disclosure generally relates to a mixed signal integrated circuit (IC) chip having an analog circuitry portion and a digital circuitry portion.

BACKGROUND

An integrated circuit (IC) chip generally incorporates one or more pins to receive input voltages for powering the IC chip.

SUMMARY

In one aspect, some implementations provide a mixed-signal integrated circuit that includes: one or more pins to receive an input voltage; a digital circuitry portion including transistors configured to be driven by the input voltage; and an analog circuitry portion including analog components configured to be driven by a regulated boosted voltage that is higher than the input voltage, the analog circuitry portion comprising a voltage booster that includes: one or more charge pump devices configured to receive the input voltage, an oscillator signal, and a control signal, wherein the one or more charge pump devices comprise a network of capacitors switchable to provide a charged pumped in response to the control signal, and wherein the one or more charge pump devices, using the charged pumped, generate a boosted voltage based on the input voltage and at least a portion of an amplitude of the oscillator signal, a voltage regulator coupled to the one or more charge pump devices and configured to receive the boosted voltage and generate a regulated boosted voltage based on the boosted voltage, and a control and monitoring engine configured to provide the control signal based on, at least in part, the input voltage, the oscillator signal, and the regulated boosted voltage.

Implementations may include one or more of the following features.

The mixed-signal integrated circuit may further include a ring oscillator configured to: receive the input voltage and the control signal; and provide the oscillator signal. A frequency of the oscillator signal may be adjustable based on, at least in part, the control signal. The boosted voltage may be increased when the frequency of the oscillator signal is increased. The boosted voltage may be decreased when the frequency of the oscillator signal is decreased.

The network of capacitors may be adjustable to affect the charge pumped such that the boosted voltage is altered. The boosted voltage may be increased when a capacitance of at least one capacitor from the network of capacitors is increased. The boosted voltage may be decreased when a capacitance of at least one capacitor from the network of capacitors is decreased.

The mixed-signal integrated circuit may include an analog-to-digital converter (ADC) to sense the boosted voltage. The ADC may include a single clocked comparator, wherein the oscillator signal drives the single clocked comparator. The single clocked comparator may be coupled to receive the input voltage, and a reference voltage. The single clocked comparator may be configured to measure the input voltage with respect to the reference voltage.

The mixed-signal integrated circuit may include a resistive ladder to divide the boosted voltage to generate the reference voltage. The mixed-signal integrated circuit may additionally include multiplexor to select the reference voltage and provide the reference voltage to the single clocked comparator. The single clocked comparator may be configured to generate a first measurement of the input voltage with respect to the reference voltage at a first time point, and generate a second measurement of the input voltage with respect to the reference voltage at a second time point. The first time point may precede the second time point. The mixed-signal integrated circuit may further include a multiplexer configured to select a first instance of the oscillator signal at the first time point, and a second instance of the oscillator signal at the second time point. The first instance of the oscillator signal may precede, in phase, the first instance of the oscillator signal. The control and monitor engine may be configured to: generate the control signal based on the first measurement at the first time point, and the second measurement at the second time point. The mixed-signal integrated circuit may further include: a bandgap reference generator configured to generate the reference voltage.

The voltage regulator may be configured to regulate the boosted voltage by reducing voltage ripples from the boosted voltage. The input voltage may be about 0.7V to 0.75V and the regulated boosted voltage is up to about multiples of the input voltage. The mixed-signal integrated circuit may be configured to drive an analog load with a load current. The frequency of the oscillator signal may be adaptively controlled based upon the load current.

The details of one or more embodiments are set forth in the accompanying drawings and the description below. Other aspects, features, and advantages will become apparent from the description, the drawings, and the claims.

DESCRIPTION OF DRAWINGS

Like reference symbols in the various drawings indicate like elements.

DETAILED DESCRIPTION

Two trends are concurrently driving the current design of analog and mixed-signal circuits. The first trend is a decrease in voltage of the power supply for an integrated circuit (IC) chip. For example, there is a continuing reduction of power supply in current deep sub-nanometer FinFET processes. In other words, this trend corresponds to a reduction in the voltage provided to power an IC chip. At the same time, the second trend is that more and more chip components are demanding differing driving voltages for improved performance. However, for consumer and Internet of Things (IOT) applications, due to cost considerations, a single lower operational power supply is preferred. Supplying a single IC chip with various higher supply voltages increases the cost of the system. For this reason, it is advantageous to have an efficient localized high voltage generator integrated with the analog circuit, which localized high voltage generator can generate the desired higher voltage from the available lower operational voltage.

The present disclosure describes various implementations that incorporate a charge pump configuration on the same IC chip as the various analog components demanding varying voltages higher than an input voltage to the IC chip. The charge pump configuration is capable of providing an adjustable voltage (that is higher than the input voltage provided to power the chip) to the various analog components on the same IC chip. The charge pump configuration therefore serves as a voltage booster. Examples of the charge pump configuration includes a PLL voltage boosting charge pump driven by a control signal and an oscillator signal. The control signal may be derived based on an output of the PLL voltage boosting charge pump, an output of a voltage reference generator, and an output of a voltage regulator. The oscillator signal may come from a ring oscillator on the same chip, or can be provided as an input clock signal to the chip. The output of the PLL voltage boosting charge pump can be adjusted by varying, for example, the oscillator signal, the capacitor on the charge pump, or the number of booster stages.

Figure 1:
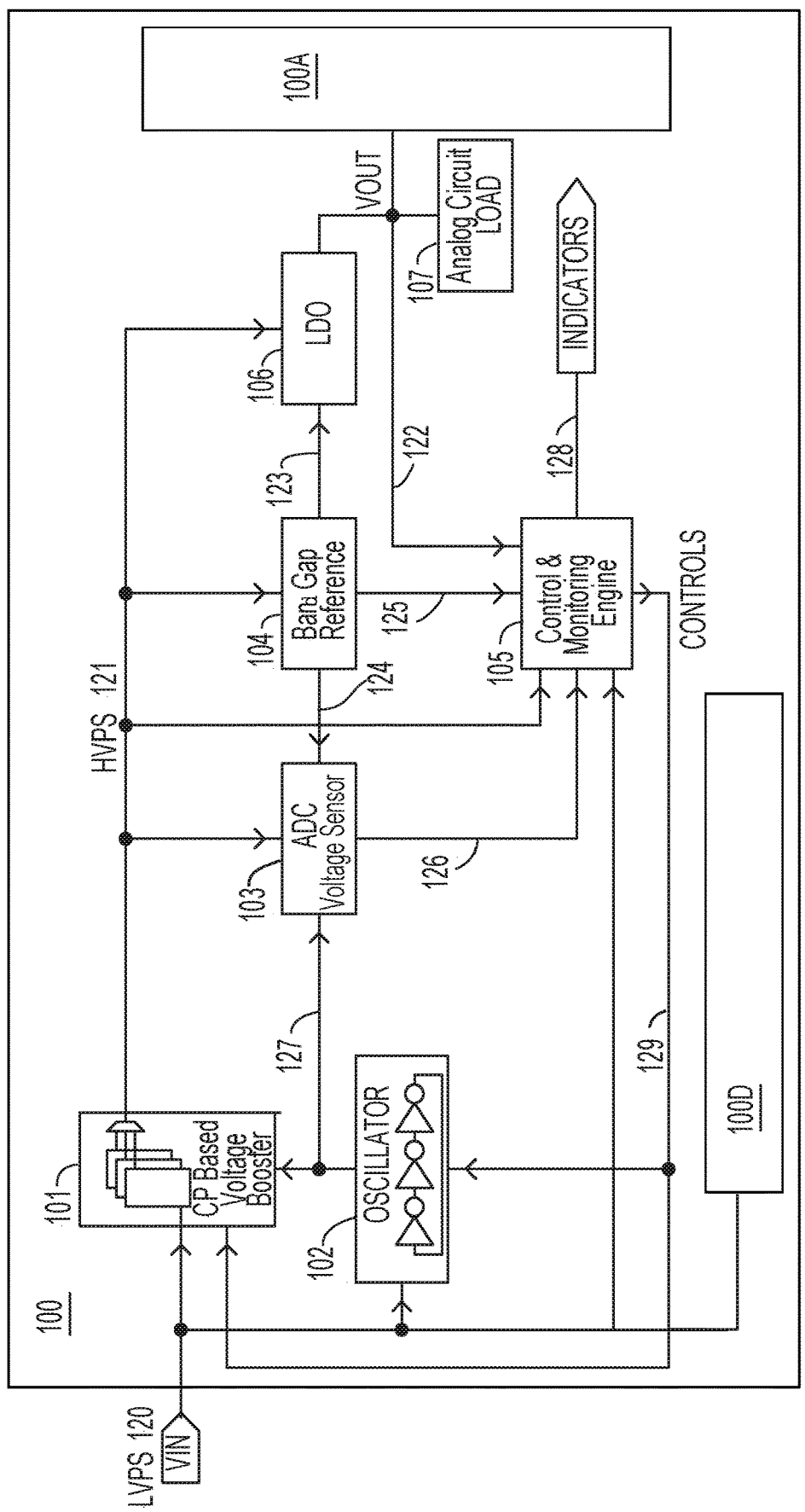
FIG. 1 illustrates an example of an IC circuit with a fully integrated a high voltage generator according to some implementations of the present disclosure.

FIG. 1 shows an example of an IC circuit 100 with fully integrated a high voltage generator. The IC circuit 100 can operate off a 0.75V supply. The high voltage generator can boost the input voltage supply internally to a 1.2V supply. The IC circuit 100 may include both low voltage and high voltage transistors, each operating on respective voltages. In particular, the IC circuit 100 can operate under a local supply voltage $V_{OUT}$ 122, where $V_{OUT}$ can be higher than $V_{IN}$ 120, receive from a pin of the IC circuit 100.

As illustrated in FIG. 1, a charge pump based voltage booster (CPVB) 101 receives a low voltage power supply (LVPS) or $V_{IN}$ 120. The IC chip on which CPVB resides may include one or more pins to receive VIN 120. However, the IC chip may not receive additional input power supplies. In other words, the IC chip may receive one input power supply. CPVB 100 can receive another input, namely, a clock (CLK) 127, which in some cases has a swing equal to the amplitude of the LVPS. This swing can refer to half of the rail-to-rail amplitude. CPVB 101 provides a high voltage power supply (HVPS) 121 as its output. In a situation where loss can be ignored, CPVB 101 accepts input voltage $V_{IN}$ at its input and produces a high voltage, for example, equal to the value of low voltage $V_{IN}$ plus amplitude of clock) at its output. If the amplitude of clock is equal to the value of low voltage, the high voltage produced can double the value of low voltage. In this example, if the LVPS and the CLK 127 are each 0.75V in amplitude, then the HVPS can be up to 1.5V. If a voltage higher than the double is desired, a multi-stage voltage booster can be used to generate three times or four times the supply voltage. The output current capability of the CPVB is dependent on the frequency of CLK 127. For example, the higher the clock frequency, the larger the current drive at output. The CPVB 101 may accept yet other inputs 129, which can be used to configure the structure of the CPVB 101, such as, for example, selecting the number of boosting stages, sizes of capacitors, sizes of active switchers.

A ring oscillator (RO) 102 can operates at the lower voltage LVPS and supply clock signal CLK 127 to the CPVB 101 and analog-digital converter (ADC) 103. The RO 102 may be at a fixed frequency (or a variable frequency that can be controlled). For example, the RO 102 can include a chain of N inverters where N is an odd number. If all N inverters are connected in a loop, RO 102 will produce a frequency of $f=1/(N\times2\times t_d)$ where $t_d$ is the delay from input to output of each cell. If N−2 inverters are connected in series, the frequency is increased to $f=1/((N-2)\times2\times t_d)$ and so on. Alternatively, the frequency could be controlled by a bias current or other analog control, which may itself may be generated and controlled by analog or digital means.

A bandgap reference generator (BG) 104 can connect to the HVPS 121. The BG 104 can produce an accurate reference voltage ($V_{REF}$) 123 of, for example, 1.2V and provide the voltage as reference to the low dropout voltage regulator (LDO) 106. The BG may also provide other reference voltages 124, 125 to the droop sensor 103 and control & monitoring engine CME 105.

A low dropout voltage regulator (LDO) 106 receives, as inputs, HVPS 121 and $V_{REF}$ 123 and produces a further regulated voltage at its output $V_{OUT}$ 122. In this example, $V_{OUT}$ 122 can be 1.2V. The LDO 106 may further remove ripples from the further regulated voltage at $V_{OUT}$ 122. As illustrated, $V_{OUT}$ 122 drives analog circuit 107 as a load.

A control and monitoring engine (CME) 105 may receive the various sensed values from the ADC 103, HVPS 121, LVPS 120, bandgap reference 125, and $V_{OUT}$ 122, and generates a control signal 129, which can appropriately configure the CPVB 101 and RO 102. In one illustration, ADC 103 senses HVPS 121 and generates a sensed signal on line 126 to feed CME 105. For example, if droop is in excess of a defined value $V_{droopH}$, CME 105 can send control signal 129 to RO 102 to increase the frequency of clock signal 127 and hence reduce the voltage droop. Alternatively, if the droop is below a defined value $V_{droopL}$, then CME 105 can send control signal 129 to RO 102 to reduce the frequency of clock signal 127. In some cases, to maintain the power consumed by this system at a desired level, the system can perform at lower frequencies (hence lower power consumption) at lower output current loads and vice versa.

The CME 105 can have an indicator output signal 128, with various functions. For example, the CME 105 can monitor the bandgap reference and indicate a signal $BG_{Good}=1$ when the CME 105 senses $V_{REF}$ is in the appropriate range. The CME 105 can monitor LVPS 120 with respect to $V_{REF}$ and indicate a signal $LV_{Good}=1$ when LVPS 120 is within appropriate range. The CME 105 can monitor HVPS 121 with respect to $V_{REF}$ and indicate a signal $HV_{Good}=1$ when HVPS 121 is within appropriate range. The CME 105 can monitors $V_{OUT}$ 122 and indicates a signal $V_{OUT\_Good}=1$ when $V_{OUT}$ 122 is within appropriate range. In some cases, the indicator output signal 128 can have multiple bits, each representing the abovementioned monitoring outputs.

Figure 2A:
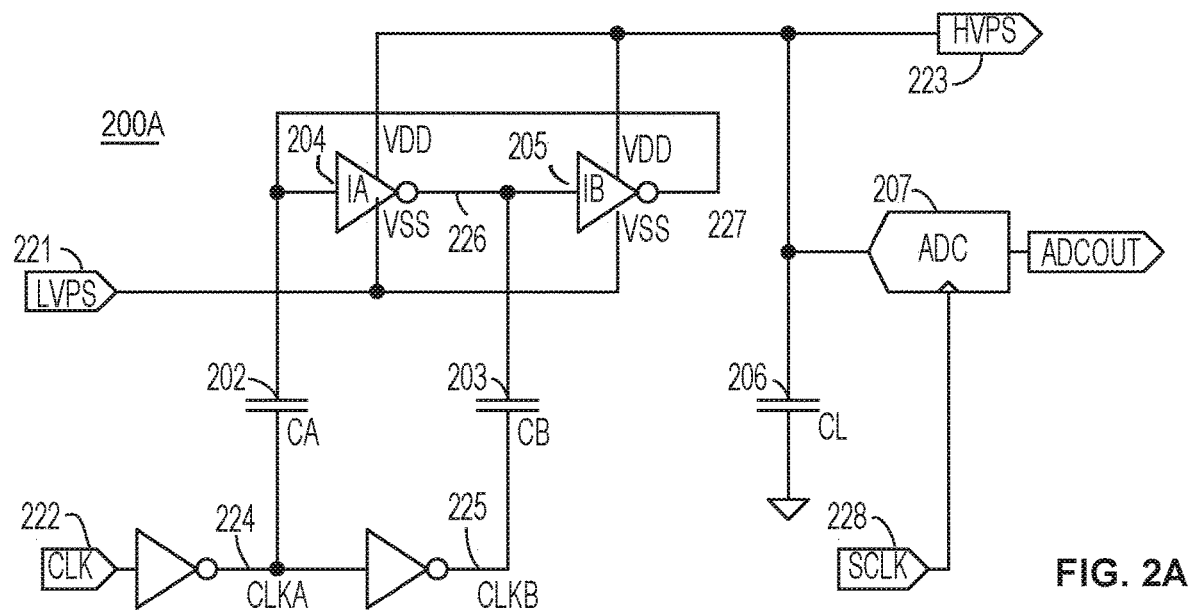
FIGS. 2A to 2C show an example of charge pump voltage booster (CPVB) to further illustrate the operation of the high voltage power supply (HVPS) ripple control mechanism according to some implementations of the present disclosure.
Figure 2B:
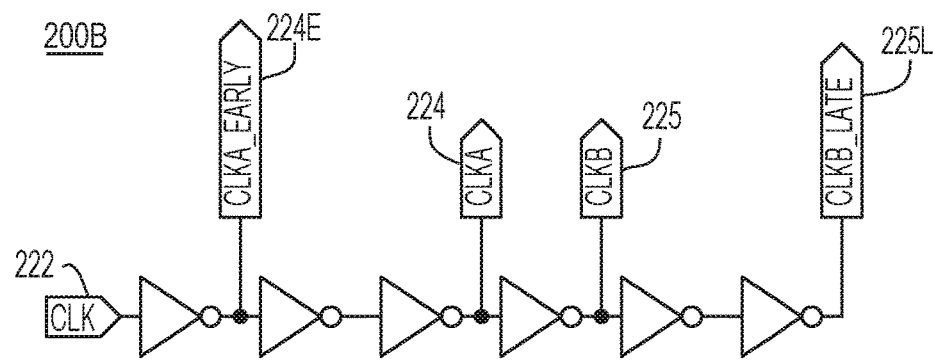
Figure 2C:
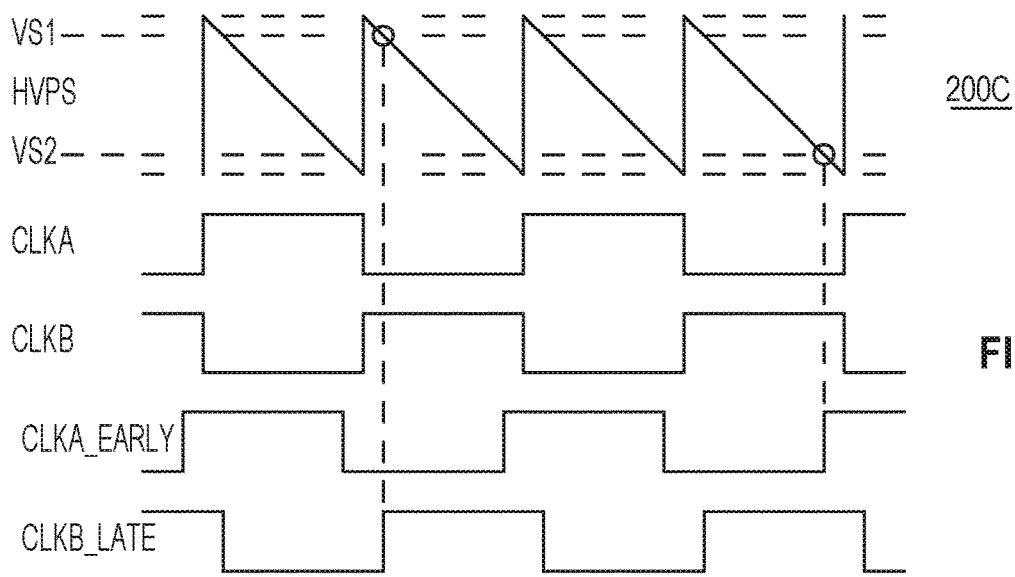

Further referring to FIGS. 2A to 2C, an example of a charge pump voltage booster (CPVB) 200A is shown to further illustrate the operation of the HVPS ripple control mechanism. FIG. 2A particularly shows a schematic of CPVB 200A, as an example of CPVB 101 in FIG. 1. Here, a core voltage or LVPS 221 is applied to the source nodes of N channel transistors of inverters 204 and 205, as indicated by $V_{SS}$. As illustrated, inverters IA 204 and IA 205 are connected in series back to back. Inverter 204 generates an inverted output at terminal 226. Inverter 205 generates an inverted output at terminal 227. A high voltage power supply (HVPS) 223 is connected to the source nodes of P channel transistors of inverters IA 204 and IA 205, as indicated by $V_{DD}$. Complementary clocks CLKA 224 and CLKB 225 may be derived from input clock CLK 222. As illustrated, CLKA 224 and CLKB 225 are respectively capacitively coupled to the gates of inverters 204 and 205 through capacitors 202 and 203. Load capacitor CL 206 is connected to HVPS 223 to smooth the ripple at HVPS 223. ADC 207 is driven by clock SCLK 228. This configuration allows a voltage build-up at HVPS 223. As illustrated, at each rising edge of CLKA or CLKB, electrical charges are injected into CL 206. At steady state, the maximum value of HVPS 223 is about double the value of LVPS 221, when the amplitude of clock signals 224 and 225 are the same as the voltage of LVPS 221.

FIG. 2B illustrates an example 200B for generating phase varied edges of CLKA and CLKB to produce SCLK. As illustrated, CLK 222 drives a series of inventors. Here, $CLKA_{EARLY}$ 224E is a phase advanced version of CLKA 224. For example, $CLKA_{EARLY}$ 224E is ahead in phase of CLKA 224 by a suitable value, as determined by the phase delay of each inverter between $CLKA_{EARLY}$ 224E and CLKA 224. $CLKB_{LATE}$ 225L is a phase delayed version of CLKB. For example, $CLKB_{LATE}$ 225L is delayed in phase of CLKB by a suitable value as determined by the phase delay of each inverter between CLKB 225 and $CLKB_{LATE}$ 225L.

FIG. 2C shows an example of a diagram 200C illustrating how $CLKB_{LATE}$ 225L samples the value of HVPS 223 at its rising edge by using an analog to digital comparator ADC 207 or other suitable method. This value is called $VS_1$, and represents the highest value of HVPS 223, i.e. $V_{MAX}$(HVPS). $CLKA_{EARLY}$ 224E samples the value of HVPS 223 at its rising edge. This value is called $VS_2$ and represents the lowest value of HVPS 223, i.e. $V_{MIN}$(HVPS). The difference between $VS_1$ and $VS_2$ is known as droop of HVPS 223 voltage.

At steady state operation, if $VS_1$ is less than a pre-defined value of, for example, 1.9×LVPS, additional capacitance can be added to CA 202 and CB 203, or alternatively additional transistors can be added to the inverters IA 204 and IB 205 to increase $V_{MAX}$(HVPS). Conversely, if $VS_1$ is higher than a pre-defined value of, for example, 1.95×LVPS, some capacitance can be deducted from CA 202 and CB 203 or alternatively some transistors can be deducted from the inverters IA 204 and IB 205 to decrease $V_{MAX}$(HVPS). In other words, depending on the sensed $VS_1$, capacitance coupled to IA 204 and IB 205 can be adjusted to induce more or less charge build-up so that the sensed $VS_1$ becomes closer to the pre-defined value. For example, more capacitors can be switchably included in or excluded from the coupling to IA 204 and IB 205.

At steady state of operation, if $VS_2$ is less than a pre-defined value of, for example, 1.8×LVPS, the frequency of CLK 222 can be increased. If $VS_2$ is more than a pre-defined value of, for example, 1.85×LVPS, the frequency of CLK 222 can be decreased. This frequency adjustment can also be done to control the value of $VS_1$. The frequency of CLK 222 can be adjusted by, for example, adjusting the configuration of RO 102. In some instances, inter-inverter delay can be adjusted. In some cases, the number of active inverters in the ring can be adjusted.

The above mentioned pre-defined values may be controlled externally or alternatively by feedback from the application. In these cases, a register file may be present on, for example, CME 105. In many cases, the droop/ripple in HVPS is periodic in nature. As such, the sampling need not be done at successive edges of clock signal CLK 222. If $VS_1$ is sampled at the rising edge of $CLKB_{LATE}$, $VS_2$ can be sampled after a few cycles of $CLKA_{EARLY}$. A slower speed of sampling can allow lower speed operation of ADC or other suitable comparison circuitry, thereby reducing power consumed.

Figure 3:
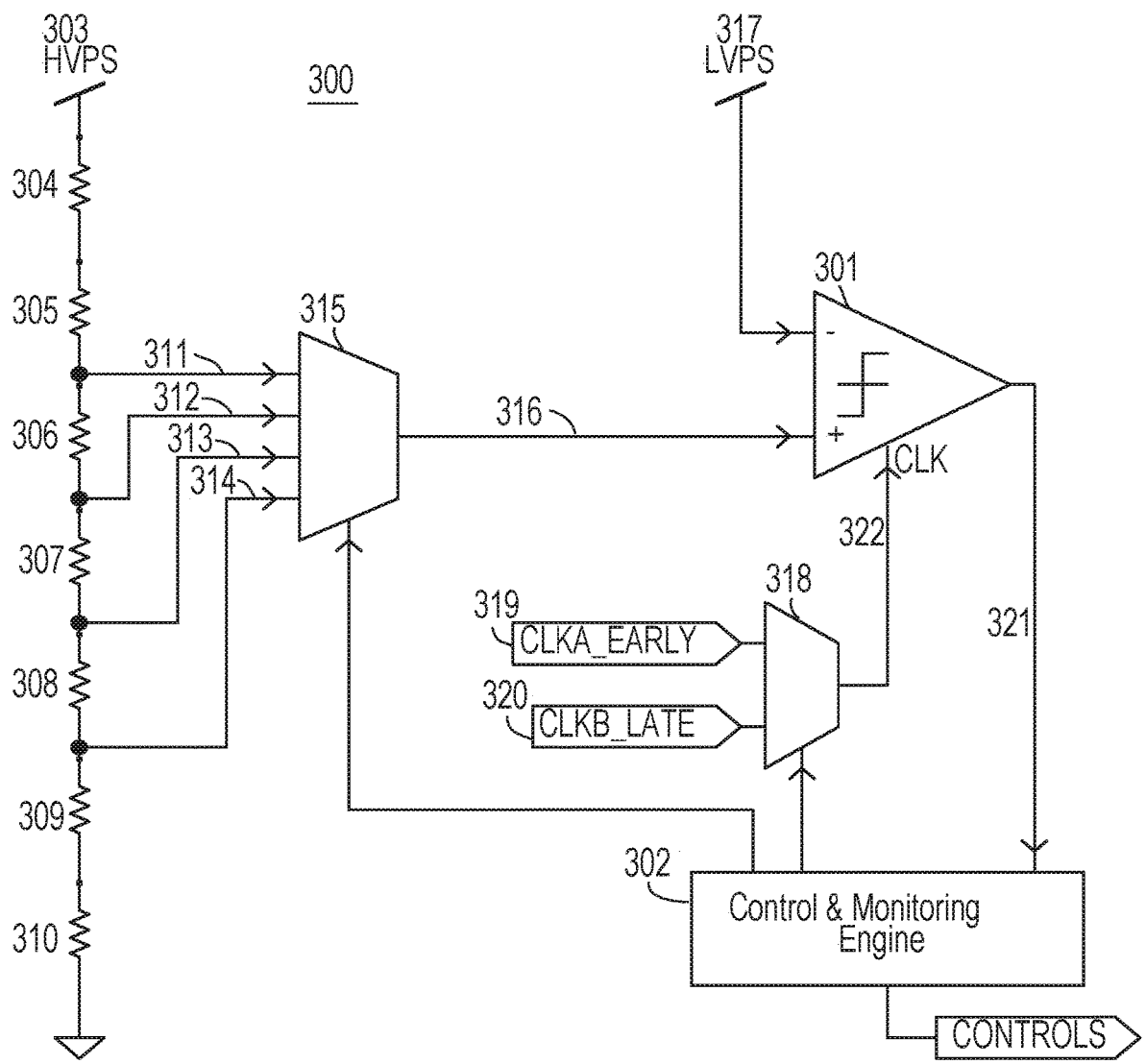
FIG. 3 illustrates the use of an ADC to monitor the voltage levels at HVPS according to some implementations of the present disclosure.

Referring further to FIG. 3, an example 300 illustrates the use of a single clocked comparator (in lieu of a conventional multi-bit ADC) to monitor the voltage levels at HVPS. In this example, control and monitoring Engine (CME) 302 controls a single clocked comparator CC 301. The use of a single comparator can greatly reduce power consumed by the monitoring circuitry. Boosted voltage HVPS 303 is resistively divided down using a resistive ladder including resistors 304, 305, 306, 307, 308, 309, and 310 and multiple taps 311, 312, 313, and 314. A set of pre-defined voltages equivalent to, for example, 1.95×LVPS, 1.9×LVPS, 1.85× LVPS and 1.8×LVPS can respectively feed into an analog multiplexer (MUX) 315. The output 316 of the analog mux 315 is provided to the positive (+) terminal of clocked comparator 301. LVPS 317 is fed into the negative (−) terminal of the same clocked comparator. A second mux 318 has, as its inputs, multiple clocks, for example $CLKA_{EARLY}$ 319 and $CLKB_{LATE}$ 320. Both mux 315 and mux 318 are controlled by the CME 302.

To determine if the highest value of HVPS, i.e. $VS_1$ is within a desired range of 1.9 to 1.95 of LVPS, the CME 302 can control mux 318 such that $CLKB_{LATE}$ is connected to the CLK node 322 of CC 301. In this configuration, two measurements can be made, namely, one measurement when node 311 is connected to 316 denoted M195 and the other measurement when node 312 is connected to 316, denoted M19. The results of the two measurements can be interpreted according to the following table 1.

TABLE 1

| M195 | M19 | Action |
|------|-----|--------|
| 0 | 0 | HVPS too low. Increase coupling cap or drive of CPVB |
| 0 | 1 | HVPS is in desired range, no action needed |
| 1 | 0 | Invalid |
| 1 | 1 | HVPS too high. Decrease coupling cap or drive of CPVB |

To determine whether the lowest value of HVPS, i.e. $VS_2$ is within desired range of 1.8 to 1.85 of LVPS, the CME 302 can control mux 318 such that $CLKA_{EARLY}$ is connected to the CLK node 322 of CC 301. In this configuration, two measurements can be made, namely, one measurement when node 313 is connected to 316 denoted M185 and another measurement when node 314 is connected to 316, denoted M18. The results of these two measurements can be interpreted based on the following table 2.

TABLE 2

| M185 | M18 | Action |
|------|-----|--------|
| 0 | 0 | Droop too high. Increase frequency of Oscillator |
| 0 | 1 | Droop is in desired range, no action needed |

TABLE 2-continued

| M185 | M18 | Action |
|---|---|---|
| 1 | 0 | Invalid |
| 1 | 1 | Droop too low. Reduce frequency of Oscillator |

By continuously monitoring and taking appropriate action, as described, the boosted voltage HVPS can be set to the desired level and droop of HVPS can be controlled to desired level at optimum efficiency.

What has been described is a method and apparatus which can be employed on a mixed signal integrated circuit (IC) chip to, for example, provide an increased voltage supply on board the chip based on an off-chip low-voltage power supply. In other words, a mixed-signal IC can be constructed out of low voltage and high voltage transistors using a fully integrated high voltage generator. Such a mixed-signal IC can operate on a single low voltage supply, as opposed to operating on dual low voltage and high voltage supplies. Based on the single low input voltage, the mixed signal IC can generate a precise higher voltage for sustaining the operations of the on-chip high-voltage transistors. The mixed signal IC can provide additional optional control bits for selecting between a range of desired output voltages for powering the on-chip high-voltage transistors. The voltage booster feature is self-contained. The examples illustrated within utilize a charge pump voltage booster (CPVB) device as a voltage booster on the mixed-signal IC chip. The clocking frequency of the CPVB can be adaptively controlled based upon the load current. Although the example of PLL circuit is advantageously employed as an on-chip component, the advantages of the application may be exploited, for example, in conjunction with microcontroller chips having very high operational frequencies. Indeed, a number of implementations have been described. For example, implementations can include a precise reference voltage generator such as a Bandgap reference (BG) to generate a precise reference voltage, using internal feedback/control mechanisms. The output(s) of the precise reference generator can be used for power supply monitoring, e.g., providing accurate output signals indicating the input voltage, the output voltage, or other values are within acceptable range(s). Nevertheless, it will be understood that various modifications can be made without departing from the spirit and scope of the subject innovation. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A mixed-signal integrated circuit, comprising:
   one or more pins to receive a first input voltage,
   a digital circuitry portion including transistors configured to be driven by the first input voltage; and
   an analog circuitry portion including analog components configured to be driven by a regulated boosted voltage that is higher than the first input voltage, the analog circuitry portion comprising a voltage booster that includes:
      one or more charge pump devices comprising: a network of capacitors switchable to provide a charge pumped in response to a clock signal such that, using the charge pumped, the network of capacitors generate a boosted voltage, and
      a voltage regulator configured to generate a regulated output voltage for a received first input voltage using the boosted voltage.

2. The mixed-signal integrated circuit of claim 1, wherein the first input voltage driving the digital circuitry portion and a second input voltage to the one or more charge pump devices are different.

3. The mixed-signal integrated circuit of claim 2, wherein the boosted voltage is increased when the first or the second input voltage is increased.

4. The mixed-signal integrated circuit of claim 2, wherein the boosted voltage is decreased when the first or the second input voltage is decreased.

* * * * *